US012727411B2

(12) United States Patent
Bassett et al.

(10) Patent No.: US 12,727,411 B2
(45) Date of Patent: Sep. 1, 2026

(54) METHODS TO IMPROVE ETCH UNIFORMITY ACROSS A SEMICONDUCTOR SUBSTRATE WHEN ETCHING WITH A HYDROFLUORIC ACID (HF) AND NITRIC ACID ($HNO_3$) SOLUTION

(71) Applicant: Tokyo Electron Limited, Tokyo (JP)

(72) Inventors: Derek Bassett, Austin, TX (US); Kate Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 224 days.

(21) Appl. No.: 18/585,340

(22) Filed: Feb. 23, 2024

(65) Prior Publication Data

US 2025/0273471 A1 Aug. 28, 2025

(51) Int. Cl.

| | |
|---|---|
| ***H10P 50/60*** | (2026.01) |
| ***C09K 13/04*** | (2006.01) |
| ***C09K 13/08*** | (2006.01) |
| ***H10P 50/64*** | (2026.01) |

(Continued)

(52) U.S. Cl.

CPC .............. *H10P 50/60* (2026.01); *C09K 13/04* (2013.01); *C09K 13/08* (2013.01); *H10P 50/64* (2026.01); *H10P 50/642* (2026.01); *H10P 50/68* (2026.01); *H10P 50/683* (2026.01); *H10P 72/0424* (2026.01)

(58) Field of Classification Search

None

See application file for complete search history.

(56) References Cited

U.S. PATENT DOCUMENTS

| | | | | |
|---|---|---|---|---|
| 2013/0244442 | A1 | 9/2013 | Ohmi et al. | |
| 2016/0141330 | A1* | 5/2016 | Wang .................... | H10F 39/026 438/69 |

(Continued)

FOREIGN PATENT DOCUMENTS

| | | |
|---|---|---|
| KR | 20130070528 | 6/2013 |
| KR | 102155111 | 9/2020 |

OTHER PUBLICATIONS

Guenais-Langlois et al., "Catalytically-mediated Generation of HNO2 In Highly HNO3 Concentrated Media", Studies In Surface Science and Catalysis 130, 2000, 6 pgs.

(Continued)

*Primary Examiner* — Jiong-Ping Lu

(74) *Attorney, Agent, or Firm* — Egan, Enders & Huston LLP.

(57) ABSTRACT

The present disclosure provides wet processing systems and methods for improving etch uniformity across a semiconductor substrate when etching a silicon surface with a hydrofluoric acid (HF) and nitric acid ($HNO_3$) etch solution (otherwise referred to herein as an HF+$HNO_3$ etch solution). More specifically, the present disclosure provides single wafer wet processing systems and methods that improve etch uniformity across a silicon surface of a semiconductor substrate by increasing the concentration of nitrous acid ($HNO_2$) in the HF+$HNO_3$ etch solution used to etch the silicon surface prior to dispensing the HF+$HNO_3$ etch solution onto the silicon surface.

20 Claims, 7 Drawing Sheets

(51) Int. Cl.
*H10P 50/68* (2026.01)
*H10P 72/00* (2026.01)

(56) References Cited

U.S. PATENT DOCUMENTS

| | | | | |
|---|---|---|---|---|
| 2018/0337253 | A1* | 11/2018 | Bilodeau | H10D 64/017 |
| 2019/0228990 | A1 | 7/2019 | Hinode et al. | |

OTHER PUBLICATIONS

Rietig et al., "A Revised Model of Silicon Oxidation During The Dissolution of Silicon in HF/HNO3 Mixtures", Royal Society of Chemistry, 2019, 12 pgs.
Acker et al., "Study on the Mechanism of Silicon Etching in HNO3-Rich HF/HNO3 Mixtures", J. Phys. Chem. C, 2007, 8 pgs.
Gen et al., "Nitrite/Nitrous Acid Generation From The Reaction of Nitrate and Fe(II) Promoted By Photolysis of Iron-Organic Complexes", Environmental Science & Technology, 2021, 9 pgs.
Ouyang et al., "A Laser Flash Photolysis Study of Nitrous Acid in The Aqueous Phase", Chemical Physics Letter, 2005, 6 pgs.
Scharko et al., "Release of Nitrous Acid and Nitrogen Dioxide From Nitrate Photolysis in Acidic Aqueous Solutions", Environmental Science & Technology, 2014, 11 pgs.
Ye et al., "Photolysis of Nitric Acid And Nitrate on Natural and Artificial Surfaces", Environmental Science & Technology, 2016, 30 pgs.
Ye et al., "Matrix Effect on Surface-Catalyzed Photolysis of Nitric Acid", Scientific Reports, 2019, 10 pgs.
Acker et al., "Experimental Studies on the Mechanism of Wet Chemical Etching of Silicon In HF/HNO3 Mixtures", Journal of The Electrochemical Society, 2005, 8 pgs.
Steinert et al., "Reactive Species Generated During Wet Chemical Etching o Silicon in HF/HNO3 Mixtures", J. Phys. Chem., 2006, 2006, 6 pgs.
Steinert et al., "Study on the Mechanism of Silicon Etching in HNO3-Rich HF/HNO3 Mixtures", J. Phys. Chem, 2007, 8 pgs.
"Notification of Transmittal of the International Search Report and the Written Opinion of the International Searching Authority, or the Declaration"; International Application No. PCT/US2025/010662; International Filing Date Jan. 8, 2025; Date of Mailing May 1, 2025; 10 pgs.

* cited by examiner $$2NO_2(aq) \rightleftarrows N_2O_4(aq)$$

$$N_2O_4(aq) + H_2O \rightleftarrows HNO_2(aq) + HNO_3(aq)$$

METHODS TO IMPROVE ETCH UNIFORMITY ACROSS A SEMICONDUCTOR SUBSTRATE WHEN ETCHING WITH A HYDROFLUORIC ACID (HF) AND NITRIC ACID ($HNO_3$) SOLUTION

BACKGROUND

The present disclosure relates to the processing of semiconductor substrates. In particular, it provides novel methods for improving etch uniformity across a semiconductor substrate when etching the substrate with an etch solution containing hydrofluoric acid (HF) and nitric acid ($HNO_3$).

Semiconductor fabrication processes may involve a wide variety of processing steps, including depositing, growing, patterning, etching, coating, developing and cleaning steps. Some of these processing steps can be performed as wet processes using various processing liquids and chemical solutions. A wide variety of wet processing systems are known including single wafer wet processing systems, which use one or more liquid nozzles to dispense processing liquid(s) onto the surface of a single semiconductor substrate, and batch processing systems which immerse a plurality (or batch) of substrates in a processing tank comprising a processing liquid or chemical solution.

A solution of hydrofluoric acid (HF) and nitric acid ($HNO_3$) in water (sometimes with acetic acid) is commonly used for bulk isotropic etching of silicon (Si) and polysilicon substrates and layers. The mechanism and kinetics of this etch chemistry have been extensively studied and are generally well understood. When used to etch a Si surface, the acid mixture first oxidizes the Si surface to generate silicon dioxide ($SiO_2$), which is then etched by the acid mixture. In recent years, researchers have shown that the chemistry of the HF+$HNO_3$ etch is very complex with many intermediate and sub-reactions forming various nitrogen species, including: nitrogen ($N_2$), nitric oxide (NO), nitrogen dioxide ($NO_2$), nitrous oxide ($N_2O$), nitrous acid ($HNO_2$), dinitrogen trioxide ($N_2O_3$) and ammonium cations ($NH_4^+$). Of these nitrogen species, nitrous acid ($HNO_2$) appears to be very important for determining the local etch rate of the etch chemistry on the Si surface.

A standard 49 wt % HF and 70 wt % $HNO_3$ etch solution in water etches the Si surface very fast, on the rate of 3-5 μm/min. The HF+$HNO_3$ etch chemistry is selective to silicon nitride (which it etches slowly), but not $SiO_2$ (which it will etch at approximately the same rate as Si). When semiconductor feature sizes were also on the order of ~μm, this etch chemistry was used extensively in the batch processing of silicon substrates. However, as feature sizes continued to shrink over time, the etch rate achieved with HF+$HNO_3$ etch chemistry was often too fast for batch processing of silicon substrates, and thus, is rarely used in current node production.

In single wafer processing systems, processing liquids and chemical solutions are typically dispensed in the center of a spinning substrate. When an HF+$HNO_3$ etch chemistry is used to etch a Si surface in a single wafer process, the etch rate at the center of the substrate tends to be significantly lower than the etch rate across the rest of the substrate, resulting in a non-uniform etch across the substrate surface. While this effect can be somewhat mitigated by scanning the liquid dispense nozzle during the dispense, there is still some degree of etch rate non-uniformity across the substrate surface.

A need, therefore, remains for new methods for improving etch uniformity across a semiconductor substrate when etching a Si surface with a hydrofluoric acid (HF) and nitric acid ($HNO_3$) etch solution.

SUMMARY

The present disclosure provides wet processing systems and methods for improving etch uniformity across a semiconductor substrate when etching a silicon surface with a hydrofluoric acid (HF) and nitric acid ($HNO_3$) etch solution (otherwise referred to herein as an HF+$HNO_3$ etch solution). More specifically, the present disclosure provides single wafer wet processing systems and methods that improve etch uniformity across a silicon surface of a semiconductor substrate by increasing the concentration of nitrous acid ($HNO_2$) in the HF+$HNO_3$ etch solution used to etch the silicon surface prior to dispensing the HF+$HNO_3$ etch solution onto the silicon surface.

According to one embodiment, a method is provided herein for improving etch uniformity across a semiconductor substrate. The method may generally begin by receiving a semiconductor substrate having a silicon-containing material exposed on a surface of the semiconductor substrate. A wide variety of silicon-containing materials may be exposed on a surface of the semiconductor substrate. For example, the silicon-containing material may be crystalline silicon, amorphous silicon, epitaxial silicon, polysilicon, or silicon dioxide ($SiO_2$). After receiving the semiconductor substrate, the method may further include dispensing an etch solution comprising a mixture of hydrofluoric acid (HF) and nitric acid ($HNO_3$) onto the surface of the semiconductor substrate while the semiconductor substrate is spinning at a rotational speed, and increasing a concentration of nitrous acid ($HNO_2$) within the etch solution prior to dispensing the etch solution onto the surface of the semiconductor substrate to improve etch uniformity of the silicon-containing material across the semiconductor substrate.

In one embodiment, the etch solution may be dispensed onto the surface of the semiconductor substrate at a location of dispense while the semiconductor substrate is spinning at the rotational speed. By increasing the concentration of nitrous acid ($HNO_2$) within the etch solution, the etch solution dispensed onto the substrate surface may etch the silicon-containing material with a uniform etch rate from the location of dispense to an edge of the semiconductor substrate.

In one embodiment, the etch solution may be dispensed onto the surface of the semiconductor substrate at (or very near) the center of the semiconductor substrate while the substrate is spinning at the rotational speed. By increasing the concentration of nitrous acid ($HNO_2$) within the etch solution, the etch solution dispensed onto the substrate surface may etch the silicon-containing material with a uniform etch rate from the center of the semiconductor substrate to an edge of the semiconductor substrate.

Various methods can be used to increase the concentration of nitrous acid ($HNO_2$) within the etch solution prior to dispensing the etch solution onto the surface of the semiconductor substrate to improve the etch uniformity of the silicon-containing material across the substrate surface.

In a first embodiment, a nitrogen-containing gas can be supplied to a chemical reservoir containing the etch solution to increase the concentration of nitrous acid ($HNO_2$) in the etch solution. The nitrogen-containing gas can be a nitrogen dioxide ($NO_2$) gas, for example.

In a second embodiment, a silicon-containing solution can be added to the etch solution to increase the concentration of nitrous acid ($HNO_2$) in the etch solution. The silicon-containing solution may comprise silica dissolved in aqueous solution, and can be supplied to: (a) a chemical reservoir containing the etch solution, or (b) a liquid supply line, which is coupled to a liquid nozzle for dispensing the etch solution onto the surface of the semiconductor substrate.

In a third embodiment, the etch solution can be exposed to ultra-violet (UV) radiation, which photolyzes the nitric acid ($HNO_3$) in the etch solution into nitrous acid ($HNO_2$) to increase the concentration of nitrous acid ($HNO_2$) in the etch solution. In one example implementation, the etch solution may be exposed to UV radiation by irradiating the etch solution with UV radiation as the etch solution passes through a flow cell, which is: (a) transparent to the UV radiation, and (b) coupled to a liquid supply line that is coupled to a liquid nozzle for dispensing the etch solution onto the surface of the semiconductor substrate.

In a fourth embodiment, the etch solution can be exposed to a noble metal surface, which catalyzes a reaction that converts a portion of the nitric acid ($HNO_3$) in the etch solution into nitrous acid ($HNO_2$) to increase the concentration of nitrous acid ($HNO_2$) in the etch solution. In one example implementation, the etch solution may be exposed to a noble metal surface by passing the etch solution through a catalytic flow cell comprising the noble metal surface. In some embodiments, the catalytic flow cell may be coupled to a liquid supply line, which is coupled to a liquid nozzle for dispensing the etch solution onto the surface of the semiconductor substrate, and the noble metal surface may be a platinum surface or an iridium surface. In some embodiments, formic acid ($CH_2O_2$) may be supplied to a chemical reservoir containing the etch solution to increase the amount of nitrous acid ($HNO_2$) generated during said exposing the etch solution to the noble metal surface.

In some embodiments, the method may increase the concentration of nitrous acid ($HNO_2$) within the etch solution by performing one or more of the following: (a) supplying a nitrogen-containing gas to a chemical reservoir containing the etch solution, wherein addition of the nitrogen-containing gas to the etch solution causes the concentration of nitrous acid ($HNO_2$) in the etch solution to be increased to maintain equilibrium in the etch solution; (b) adding a silicon-containing solution to the etch solution, wherein the silicon-containing solution catalyzes a reaction to convert a portion of the nitric acid ($HNO_3$) in the etch solution into nitrous acid ($HNO_2$) to increase the concentration of nitrous acid ($HNO_2$) in the etch solution; (c) exposing the etch solution to ultra-violet (UV) radiation, wherein the UV radiation photolyzes the nitric acid ($HNO_3$) in the etch solution into nitrous acid ($HNO_2$) to increase the concentration of nitrous acid ($HNO_2$) in the etch solution; and (d) exposing the etch solution to a noble metal surface, wherein the noble metal surface catalyzes a reaction that converts a portion of the nitric acid ($HNO_3$) in the etch solution into nitrous acid ($HNO_2$) to increase the concentration of nitrous acid ($HNO_2$) in the etch solution.

According to another embodiment, a wet processing system is provided herein for improving etch uniformity across a semiconductor substrate. The wet processing system disclosed herein may generally include a wafer support mechanism, a chemical supply system and at least one liquid nozzle. The wafer support mechanism may be disposed within a process chamber of the wet processing system and may be configured to support a semiconductor substrate received within the process chamber. The semiconductor substrate may be one having a silicon-containing material exposed on a surface of the semiconductor substrate. The chemical supply system may be coupled to the process chamber via a liquid supply line. In addition to other components, the chemical supply system may include a chemical reservoir containing an etch solution comprising a mixture of hydrofluoric acid (HF) and nitric acid ($HNO_3$). The at least one liquid nozzle may be disposed within the process chamber and may be coupled to the liquid supply line for dispensing the etch solution onto the surface of the semiconductor substrate. When dispensed onto the substrate surface, the etch solution may etch the silicon-containing material exposed on the surface of the semiconductor substrate. Some embodiments of the wet processing system may further include a gas supply system, a UV transparent flow cell and UV source, and/or a catalytic flow cell having a noble metal surface, as discussed below.

The wet processing system described herein increases a concentration of nitrous acid ($HNO_2$) within the etch solution prior to dispensing the etch solution onto the surface of the semiconductor substrate to improve etch uniformity of the silicon-containing material across the semiconductor substrate. Various methods can be used to increase the concentration of nitrous acid ($HNO_2$) within the etch solution, as discussed further herein.

In a first embodiment, the wet processing system may further include a gas supply system, which is coupled to the chemical supply system for supplying a nitrogen-containing gas to the chemical reservoir, or to the liquid supply line, to increase the concentration of nitrous acid ($HNO_2$) within the etch solution prior to dispensing the etch solution onto the surface of the semiconductor substrate. The nitrogen-containing gas can be, for example, a nitrogen dioxide ($NO_2$) gas.

In a second embodiment, a silicon-containing solution may be supplied to the chemical reservoir containing the etch solution, or to the liquid supply line, to increase the concentration of nitrous acid ($HNO_2$) in the etch solution prior to dispensing the etch solution onto the surface of the semiconductor substrate. The silicon-containing solution can be, for example, silica dissolved in aqueous solution.

In a third embodiment, the wet processing system may further include: (a) a UV transparent flow cell coupled to the liquid supply line, and (b) a UV source coupled for irradiating the etch solution with UV radiation as the etch solution passes through the UV transparent flow cell. In such an embodiment, the UV radiation photolyzes the nitric acid ($HNO_3$) in the etch solution into nitrous acid ($HNO_2$) to increase the concentration of nitrous acid ($HNO_2$) in the etch solution prior to dispensing the etch solution onto the surface of the semiconductor substrate.

In a fourth embodiment, the wet processing system may further include a catalytic flow cell having a noble metal surface. The catalytic flow cell may be coupled to the liquid supply line. As the etch solution passes through the catalytic flow cell, the noble metal surface within the catalytic flow cell may catalyze a reaction that converts the nitric acid ($HNO_3$) in the etch solution into nitrous acid ($HNO_2$) to increase the concentration of nitrous acid ($HNO_2$) in the etch solution prior to dispensing the etch solution onto the surface of the semiconductor substrate. In some embodiments, formic acid ($CH_2O_2$) may be added to the chemical reservoir containing the etch solution to increase the amount of nitrous acid ($HNO_2$) generated by passing the etch solution through the catalytic flow cell.

Various embodiments of wet processing systems and methods are provided herein for processing a substrate, and more specifically, for improving etch uniformity across a semiconductor substrate when etching a silicon surface with an HF+$HNO_3$ etch solution. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides wet processing systems and methods for improving etch uniformity across a semiconductor substrate when etching a silicon surface with a hydrofluoric acid (HF) and nitric acid ($HNO_3$) etch solution (otherwise referred to herein as an HF+$HNO_3$ etch solution). More specifically, the present disclosure provides single wafer wet processing systems and methods that improve etch uniformity across a silicon surface of a semiconductor substrate by increasing the concentration of nitrous acid ($HNO_2$) in the HF+$HNO_3$ etch solution used to etch the silicon surface prior to dispensing the HF+$HNO_3$ etch solution onto the silicon surface.

Figure 1:
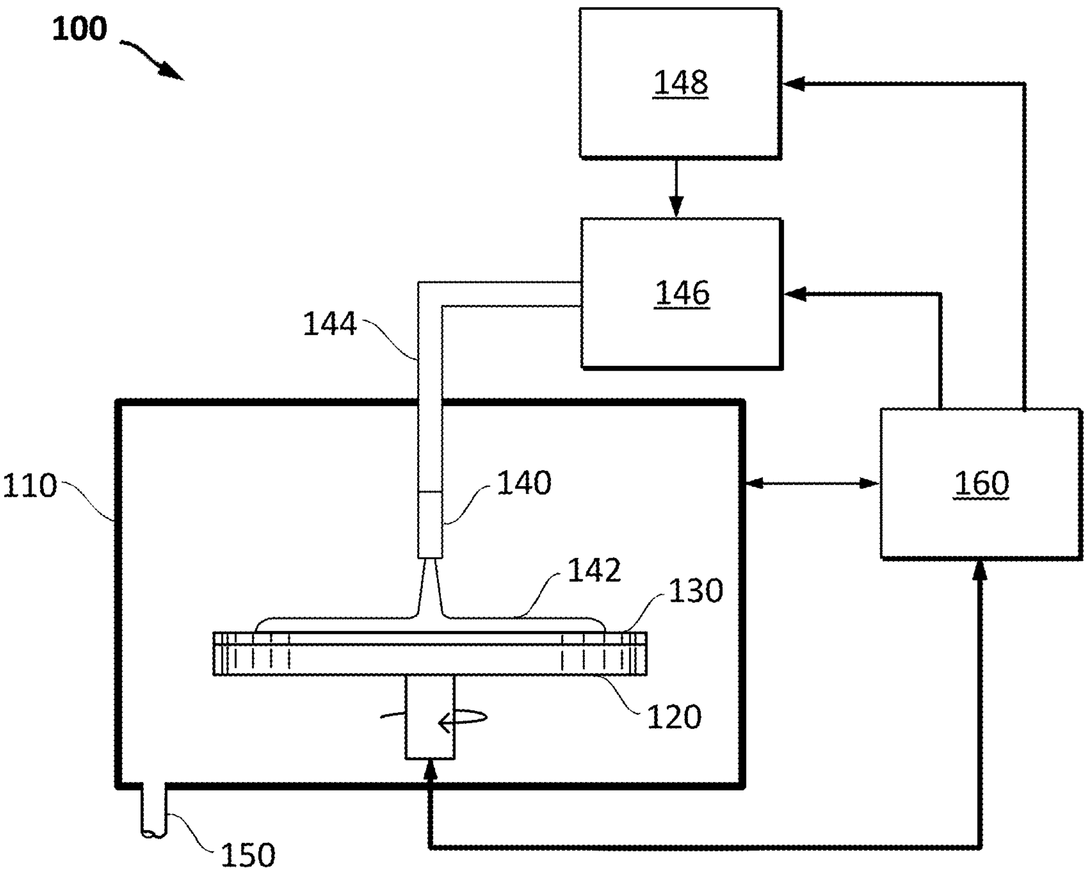
FIG. 1 is a schematic diagram illustrating one example of a wet processing system that can be used to dispense an etch solution onto a surface of a spinning substrate.

Turning now to the Drawings, FIG. 1 illustrates one embodiment of a wet processing system 100 that can be used to process a semiconductor substrate in accordance with the present disclosure. The wet processing system 100 shown in FIG. 1 is a spin chamber, which uses a spin chuck to rotate or spin a semiconductor substrate (or wafer) mounted onto the spin chuck, and at least one liquid nozzle for dispensing one or more processing liquids or chemical solutions onto the substrate surface while the substrate is spinning. In some embodiments, the at least one liquid nozzle may be used to dispense an etch solution onto a surface of a spinning substrate, as described further herein.

As shown in FIG. 1, the wet processing system 100 includes a process chamber 110 (or a spin chamber) having a wafer support mechanism 120 (or spin chuck), which is configured to support a semiconductor substrate 130 and spin or rotate at a rotational speed. An electrostatic force or vacuum pressure can be applied to the wafer support mechanism 120 to hold or clamp the substrate 130 onto the wafer support mechanism 120. In one example, the semiconductor substrate 130 may comprise silicon or have a silicon-containing material exposed on a surface the substrate.

The wet processing system 100 shown in FIG. 1 further includes a liquid nozzle 140, which is positioned over the semiconductor substrate 130 for dispensing an etch solution 142 onto a surface of the substrate. In some embodiments, the liquid nozzle 140 may be positioned above a center of the semiconductor substrate 130 for dispensing the etch solution 142 onto the substrate surface at (or very near) the center of the semiconductor substrate 130. In other embodiments, the liquid nozzle 140 may be positioned above other portions of the semiconductor substrate 130 or may be translatable across the substrate surface.

The etch solution 142 dispensed onto the surface of the semiconductor substrate 130 may include a mixture of various processing liquids, including but not limited to, hydrofluoric acid (HF) and nitric acid ($HNO_3$). The etch solution 142 is stored within a chemical supply system 146. As shown in FIGS. 4-7 and described further herein, the chemical supply system 146 may include one or more reservoirs for holding various processing liquids and chemical solutions and a chemical injection manifold, which is fluidly coupled to the process chamber 110 via a liquid supply line 144. In operation, the chemical supply system 146 may selectively apply desired chemicals to the process chamber 110 via the liquid supply line 144 and the liquid nozzle 140 positioned within the process chamber 110.

Thus, the chemical supply system 146 can be used to dispense the etch solution 142 onto the surface of the semiconductor substrate 130. The process chamber 110 may further include a drain 150 for removing the etch solution 142 from the process chamber 110, as shown in FIG. 1.

The wet processing system 100 may also include a gas supply system 148 for supplying one or more gases to the chemical supply system 146. In some embodiments, the gas supply system 148 may be coupled for supplying a nitrogen-containing gas to a chemical reservoir included within the chemical supply system 146 or the liquid supply line 144. For example, a nitrogen dioxide ($NO_2$) gas may be supplied to a chemical reservoir containing a mixture of hydrofluoric acid (HF) and nitric acid ($HNO_3$) to increase the concentration of nitrous acid ($HNO_2$) in the mixture. The $NO_2$ gas may be provided from a gas tank provided within the gas supply system 148 or may be generated in situ by combining nitric oxide (NO) and oxygen ($O_2$) gases, or ammonia ($NH_3$) and oxygen ($O_2$) gases, through combustion or catalytic oxidation.

Components of the wet processing system 100 can be coupled to, and controlled by, a controller 160, which in turn, can be coupled to a corresponding memory storage unit and user interface (not shown). Various processing operations can be executed via the user interface, and various processing recipes and operations can be stored in the memory storage unit. Accordingly, a given substrate 130 can be processed within the process chamber 110 in accordance with a particular recipe. In some embodiments, a given substrate 130 can be processed within the process chamber 110 in accordance with an etch recipe that utilizes the techniques described herein to etch a silicon surface using an etch chemistry comprising a mixture of hydrofluoric acid (HF) and nitric acid ($HNO_3$).

The controller 160 shown in block diagram form in FIG. 1 can be implemented in a wide variety of manners. In one example, the controller 160 may be a computer. In another example, the controller 160 may include one or more programmable integrated circuits that are programmed to provide the functionality described herein. For example, one or more processors (e.g., a microprocessor, microcontroller, central processing unit, etc.), programmable logic devices (e.g., a complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits can cause the programmable integrated circuits to perform the processes, functions, and/or capabilities described herein. Other variations could also be implemented.

As shown in FIG. 1, the controller 160 may be coupled to various components of the wet processing system 100 to receive inputs from, and provide outputs to, the components. For example, the controller 160 may be coupled to: the process chamber 110 for controlling the temperature and/or pressure within the process chamber 110; the wafer support mechanism 120 for controlling the rotational speed of the wafer support mechanism 120; the chemical supply system 146 for controlling the etch solution 142 dispensed onto the semiconductor substrate 130; and the gas supply system 148 for controlling a gas supplied to a chemical reservoir included within the chemical supply system 146 or the liquid supply line 144. The controller 160 may control other processing system components not shown in FIG. 1, as is known in the art.

In some embodiments, the wet processing system 100 shown in FIG. 1 may be utilized to etch a silicon surface of the semiconductor substrate 130 received within the process chamber 110 and mounted onto the wafer support mechanism 120. For example, the wet processing system 100 may etch the silicon surface of the semiconductor substrate 130 by dispensing an etch solution comprising a mixture of hydrofluoric acid (HF) and nitric acid ($HNO_3$) onto the surface of the semiconductor substrate 130 while the substrate is spinning at a rotational speed. Such an etch solution is referred to herein as a HF+$HNO_3$ etch solution.

Figure 2:
FIG. 2 is a graph of experimental etch results illustrating a non-uniform etch rate achieved when an HF+$HNO_3$ etch solution is dispensed in the center of a spinning substrate.
Figure 2:
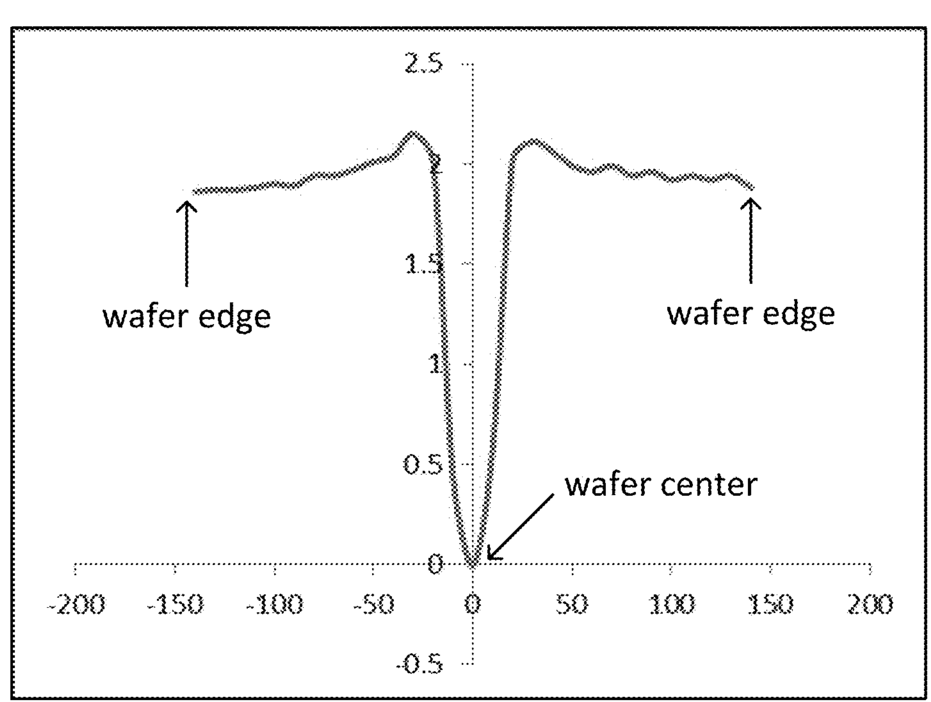

Experiments were conducted to determine the rate at which an HF+$HNO_3$ etch solution etches a silicon surface of a semiconductor substrate. FIG. 2 is a graph 200 of experimental etch results obtained by dispensing an HF+$HNO_3$ etch solution comprising 49 wt % HF and 70 wt % $HNO_3$ in water in the center of a 300 mm semiconductor substrate, while the substrate is spinning at a rotational speed (e.g., 600 rotations per minute, RPM). The semiconductor substrate used in the etch experiments is bare silicon. The graph 200 depicts the etch rate (expressed in μm/min) achieved across the silicon surface from the wafer center (0 mm) to the wafer edge (±150 mm).

As shown in the graph 200, little to no etching occurred at the center of the substrate where the HF+$HNO_3$ etch solution was dispensed. As the etch solution spread away from the center of the substrate (i.e., the location of dispense) across the surface of the spinning substrate, the etch rate steadily increased until reaching an etch rate of approximately 2 μm/min at approximately 25-30 mm away from the substrate center. This etch rate was then generally maintained across the remainder of the substrate surface. The graph 200 depicted in FIG. 2 shows that, while the HF+$HNO_3$ etch solution provides substantially uniform etching of the silicon surface away from the center of the substrate, it provides a significantly lower etch rate near the center of the substrate, thus providing a non-uniform etch rate across the substrate surface.

It is theorized that, while the nitric acid ($HNO_3$) in the HF+$HNO_3$ etch solution does not directly oxidize the silicon surface, the silicon surface acts as a catalyst to convert a portion of the nitric acid ($HNO_3$) into various nitrogen species, including: nitrogen ($N_2$), nitric oxide (NO), nitrogen dioxide ($NO_2$), nitrous oxide ($N_2O$), nitrous acid ($HNO_2$), dinitrogen trioxide ($N_2O_3$) and ammonium cations ($NH_4^+$). Of these nitrogen species, nitrous acid ($HNO_2$) is believed to play an important role in oxidizing the silicon surface, which is then etched by HF. As shown in the graph 200 of FIG. 2, the etch rate of the silicon surface is very low near the center of the substrate since there is very little nitrous acid ($HNO_2$) in the HF+$HNO_3$ etch solution at equilibrium. As the HF+$HNO_3$ etch solution spreads across the surface of the spinning substrate, reaction(s) between the silicon surface and the nitric acid ($HNO_3$) in the HF+$HNO_3$ etch solution increase the concentration of nitrous acid ($HNO_2$) in the etch solution until it reaches a high enough concentration to oxidize the silicon surface.

While it may be intuitive to increase the concentration of nitrous acid ($HNO_2$) in the HF+$HNO_3$ etch solution to improve the etch rate of the silicon surface near the center of the substrate, $HNO_2$ is not very stable and will decompose to other nitrogen compounds on the order of a few minutes. For this reason, the present inventors devised new wet processing systems and methods for increasing the $HNO_2$ concentration in the $HF+HNO_3$ etch solution near the point of use. By increasing the $HNO_2$ concentration in the $HF+HNO_3$ etch solution near the point of use, the systems and methods described herein are able to provide a higher etch rate at the center of the substrate (or other dispense location) and a more uniform etch rate across the substrate surface, while avoiding decomposition of the $HNO_2$ in the $HF+HNO_3$ etch solution.

Figure 3:
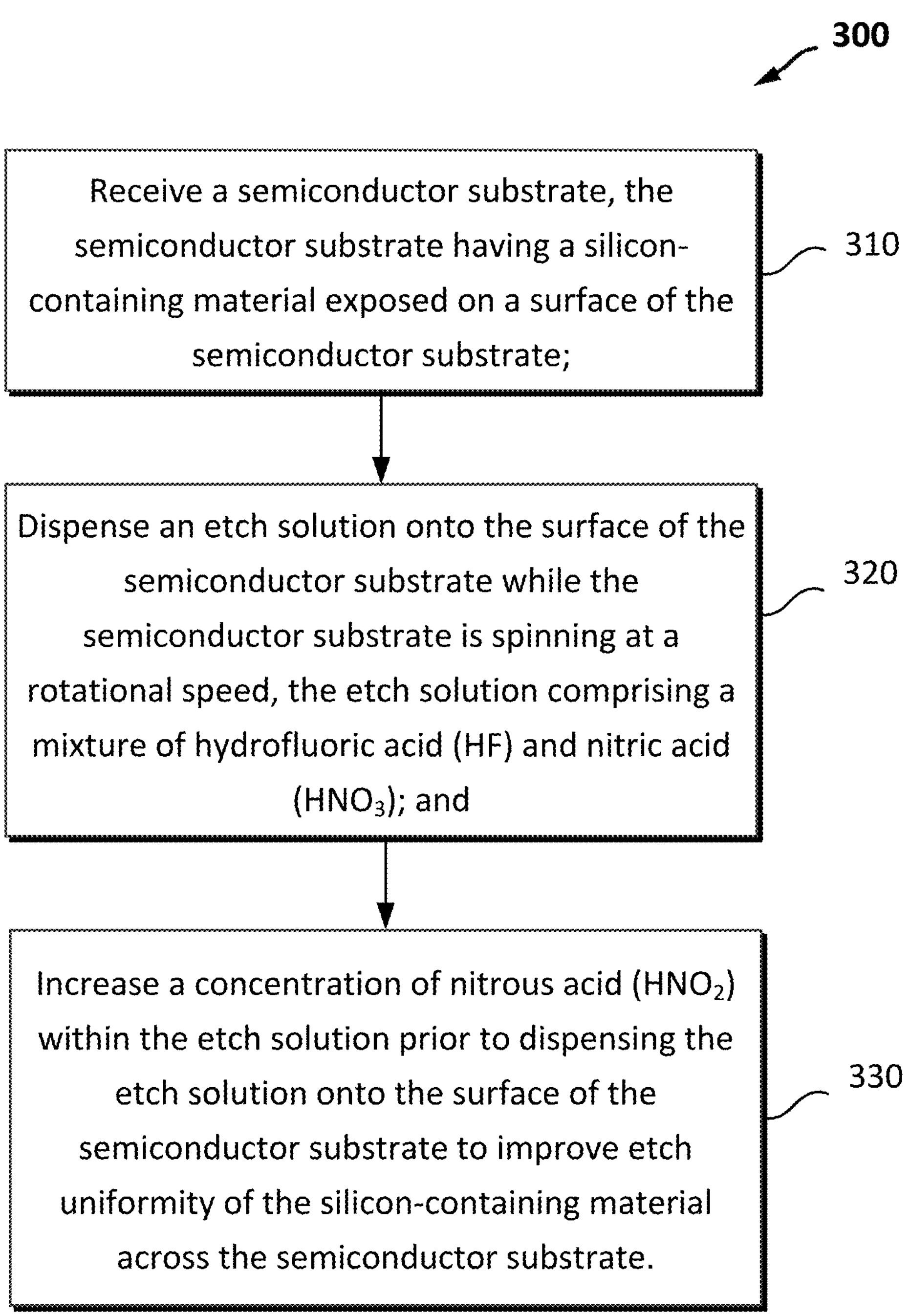
FIG. 3 is a flowchart diagram illustrating one embodiment of a method that utilizes the techniques described herein to improve etch uniformity across a semiconductor substrate by increasing the nitrous acid ($HNO_2$) concentration within the HF+$HNO_3$ etch solution prior to dispensing the etch solution onto the surface of a spinning substrate.

FIG. 3 illustrates one embodiment of a method 300 that utilizes the techniques described herein to improve etch uniformity across a surface of a semiconductor substrate when using an $HF+HNO_3$ etch solution. More specifically, the method 300 shown in FIG. 3 improves etch uniformity across a silicon surface of a semiconductor substrate by increasing the concentration of nitrous acid ($HNO_2$) in the $HF+HNO_3$ etch solution used to etch the silicon surface prior to dispensing the $HF+HNO_3$ etch solution onto the silicon surface. The method 300 shown in FIG. 3 can be performed within a variety of single wafer wet processing systems. In one embodiment, the method 300 shown in FIG. 3 may be performed within a single wafer wet processing system (e.g., a spin chamber) similar to that shown in FIG. 1 and described above. It is recognized, however, that the method 300 may be performed within other single wafer wet processing systems, as is known in the art.

In the embodiment shown in FIG. 3, the method 300 begins by receiving a semiconductor substrate having a silicon-containing material exposed on a surface of the semiconductor substrate in step 310. A wide variety of silicon-containing materials may be exposed on a surface of the semiconductor substrate. For example, the silicon-containing material may be crystalline silicon (Si), amorphous (a-Si), epitaxial (epi-Si), polysilicon (poly-Si), or silicon dioxide ($SiO_2$).

After receiving the semiconductor substrate in step 310, the method 300 dispenses an etch solution comprising a mixture of hydrofluoric acid (HF) and nitric acid ($HNO_3$) onto the surface of the semiconductor substrate in step 320. The etch solution may be dispensed onto the surface of the semiconductor substrate at a fixed location of dispense. In one embodiment, the etch solution may be dispensed onto the substrate surface at (or very near) the center of the semiconductor substrate, while the substrate is spinning at a rotational speed. For example, the etch solution may be dispensed from a liquid nozzle, which is positioned above a center of the semiconductor substrate for dispensing the etch solution onto the substrate surface at (or very near) the center of the semiconductor substrate, as generally shown in FIG. 1 and described above. It is recognized, however, that the etch solution may alternatively be dispensed onto the substrate surface at other fixed locations, or may be dispensed while the liquid nozzle is translated across the substrate surface.

The method 300 further includes increasing a concentration of nitrous acid ($HNO_2$) within the etch solution (in step 330) prior to dispensing the etch solution onto the surface of the semiconductor substrate (in step 320) to improve the etch uniformity of the silicon-containing material across the semiconductor substrate. By increasing the $HNO_2$ concentration within the etch solution prior to dispense, the method 300 enables the silicon-containing material to be etched with a substantially uniform etch rate from the location of dispense (e.g., the center of the semiconductor substrate) to the edge of the semiconductor substrate.

Various methods can be used to increase the concentration of nitrous acid ($HNO_2$) within the etch solution (in step 330) prior to dispensing the etch solution onto the surface of the semiconductor substrate (in step 320) to improve the etch uniformity of the silicon-containing material across the substrate surface. For example, the $HNO_2$ concentration can be increased within the etch solution (in step 330) by performing one or more of the following: (a) supplying a nitrogen-containing gas to a chemical reservoir containing the etch solution; (b) adding a silicon-containing solution to the etch solution; (c) exposing the etch solution to ultraviolet (UV) radiation to photolyze the nitric acid ($HNO_3$) in the etch solution into nitrous acid ($HNO_2$); and (d) exposing the etch solution to a noble metal surface catalyst that converts the nitric acid ($HNO_3$) in the etch solution into nitrous acid ($HNO_2$).

FIGS. 4-7 illustrate various embodiments of methods that can be used to increase the $HNO_2$ concentration within an $HF+HNO_3$ etch solution (in step 330) prior to dispensing the etch solution onto the surface of a spinning substrate (in step 320). The methods shown in FIGS. 4-7 can be performed within a variety of single wafer wet processing systems. In one embodiment, the methods shown in FIGS. 4-7 may be performed within a single wafer wet processing system (e.g., a spin chamber) similar to that shown in FIG. 1 and described above. It is recognized, however, that the methods may also be performed within other single wafer wet processing systems, as is known in the art.

Figures 4A, 4B:
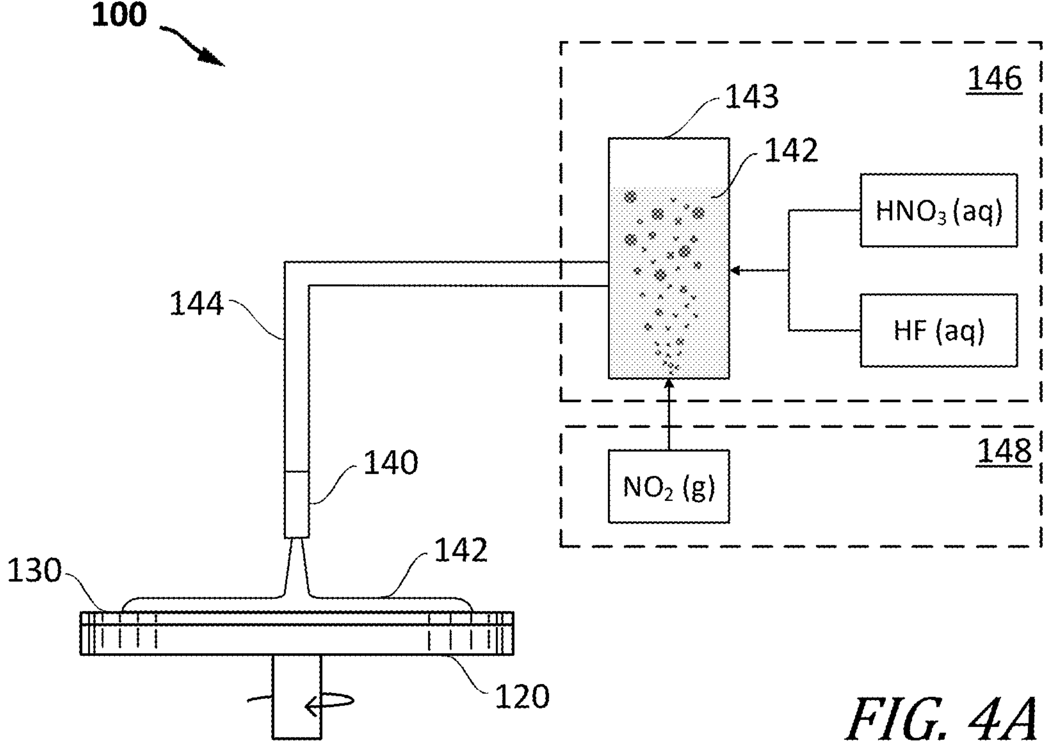
FIG. 4A illustrates a first method that can be used to increase the $HNO_2$ concentration of an HF+$HNO_3$ etch solution by supplying a nitrogen-containing gas to the HF+$HNO_3$ etch solution prior to dispensing the etch solution onto the surface of a spinning substrate.
FIG. 4B illustrates equations depicting an equilibrium relationship between nitrogen dioxide ($NO_2$), dinitrogen tetroxide ($N_2O_4$), nitrous acid ($HNO_2$) and nitric acid ($HNO_3$) in an HF+$HNO_3$ solution.

FIGS. 4A-4B illustrate a first method that can be used to increase the $HNO_2$ concentration within an $HF+HNO_3$ etch solution prior to dispensing the etch solution onto the surface of a spinning substrate. In the embodiment shown in FIGS. 4A-4B, the $HNO_2$ concentration is increased in the $HF+HNO_3$ etch solution by bubbling a nitrogen-containing gas into a chemical reservoir containing the etch solution.

FIG. 4A depicts portions of the wet processing system 100 shown in FIG. 1, including the wafer support mechanism 120, at least one liquid nozzle 140, chemical supply system 146 and gas supply system 148. As shown in FIG. 4A, the chemical supply system 146 includes a chemical reservoir 143 containing an etch solution 142 comprising a mixture of hydrofluoric acid (HF) and nitric acid ($HNO_3$). In some embodiments, the etch solution 142 may be a mixture of 49 wt % HF and 70 wt % $HNO_3$ in water (or another solvent, such as acetic acid). Other mixtures of HF and $HNO_3$ in water or other solvents may also be used.

In the embodiment shown in FIG. 4A, the gas supply system 148 is coupled to the chemical supply system 146 for supplying a nitrogen-containing gas to the chemical reservoir 143 (or another fluid flow component, such as the liquid supply line 144). The nitrogen-containing gas can be nitrogen dioxide ($NO_2$), as shown in FIG. 4A. Bubbling a nitrogen-containing gas into the chemical reservoir 143 (or liquid supply line 144) is one manner in which the concentration of nitrous acid ($HNO_2$) can be increase in the $HF+HNO_3$ etch solution.

Le Chatelier's principle states that if a dynamic equilibrium is disturbed by changing the conditions, the position of equilibrium shifts to counteract the change to reestablish an equilibrium. As shown in FIG. 4B, an equilibrium relationship exists between nitrogen dioxide ($NO_2$), dinitrogen tetroxide ($N_2O_4$), nitric acid ($HNO_3$) and nitrous acid ($HNO_2$) in the $HF+HNO_3$ etch solution. By Le Chatelier's principle, increasing the concentration of $NO_2$ dissolved within the $HF+HNO_3$ etch solution increases the concentration of $N_2O_4$, which in turn, increases the concentration of $HNO_2$ within the $HF+HNO_3$ etch solution. Stated another way, the addition of $NO_2$ to the etch solution causes a necessary shift (i.e., an increase) in the $HNO_2$ concentration in the etch solution to counteract the addition of $NO_2$ and maintain equilibrium in the etch solution.

in the embodiment shown in FIG. 4A, the nitrogen-containing gas can be added to the etch solution by bubbling $NO_2$ gas into the chemical reservoir 143 containing the etch solution 142 prior to dispensing the etch solution 142 onto the substrate surface. By adding a nitrogen-containing gas (such as $NO_2$) before the etch solution 142 is dispensed onto the substrate surface, the embodiment shown in FIG. 4A increases the concentration of $HNO_2$ in the etch solution 142 at the location of dispense, thereby increasing the etch rate of the silicon-containing material on the semiconductor substrate 130 at the location of dispense and improving the etch uniformity across the substrate surface.

The increase in $HNO_2$ concentration is directly proportional to the partial pressure of the $NO_2$ gas supplied to the chemical reservoir 143. In some embodiments, the $NO_2$ gas pressure can be selected by the controller 160 to increase the $HNO_2$ concentration within the HF+$HNO_3$ etch solution by a desired amount, thereby controlling the etch rate of the silicon-containing material on the semiconductor substrate 130 and improving the etch uniformity across the substrate surface. The $NO_2$ gas pressure can be increased by any suitable amount, up to the safety/hardware limitations imposed on the chemical supply system 146.

Figure 5A:
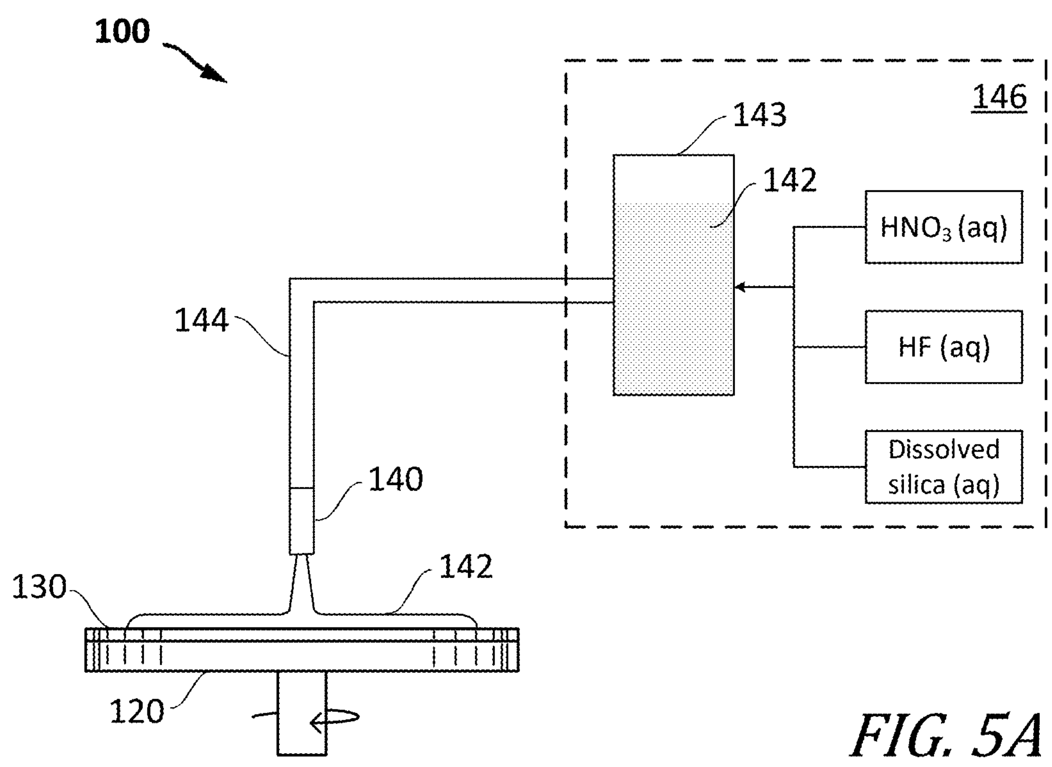
FIGS. 5A-5B illustrate a second method that can be used to increase the $HNO_2$ concentration of an HF+$HNO_3$ etch solution by adding a silicon-containing solution into the etch solution prior to dispensing the etch solution onto the surface of a spinning substrate.
Figure 5B:
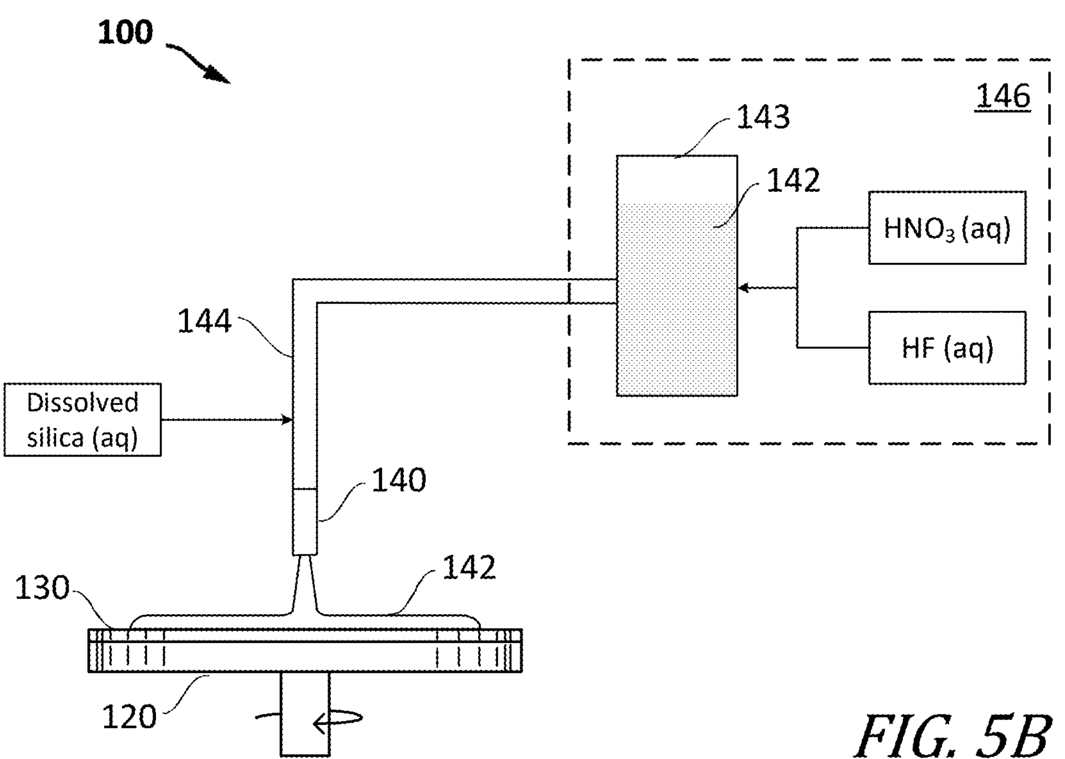

FIGS. 5A-5B illustrate a second method that can be used to increase the $HNO_2$ concentration within an HF+$HNO_3$ etch solution prior to dispensing the etch solution onto the surface of a spinning substrate. In the embodiment shown in FIGS. 5A-5B, the $HNO_2$ concentration is increased in the HF+$HNO_3$ etch solution by adding a silicon-containing solution into the etch solution prior to dispensing the etch solution onto the surface of a spinning substrate.

FIGS. 5A-5B depict portions of the wet processing system 100 shown in FIG. 1, including the wafer support mechanism 120, at least one liquid nozzle 140 and chemical supply system 146. As shown in FIGS. 5A-5B, the chemical supply system 146 includes a chemical reservoir 143 containing an etch solution 142 comprising a mixture of hydrofluoric acid (HF) and nitric acid ($HNO_3$). In some embodiments, the etch solution 142 may be a mixture of 49 wt % HF and 70 wt % $HNO_3$ in water (or another solvent, such as acetic acid). Other mixtures of HF and $HNO_3$ in water or other solvents may also be used.

In the embodiment shown in FIG. 5A, a silicon-containing solution is supplied to the chemical reservoir 143 containing the etch solution 142 prior to dispensing the etch solution 142 onto the surface of the semiconductor substrate 130. In the shown in FIG. 5B, a silicon-containing solution is supplied to the liquid supply line 144 prior to dispensing the etch solution 142 onto the surface of the semiconductor substrate 130. The silicon-containing solution may include silica dissolved in aqueous solution, as shown in FIGS. 5A and 5B. For example, the simplest soluble form of silica, orthosilicic acid ($Si(OH)_4$), may be used in the silicon-containing solution. Although silica may be preferred in some embodiments, the silicon-containing solution may also include other forms of silicon (e.g., powdered silicon) dissolved in solution. The silicon-containing solution added to the etch solution 142 catalyzes the reaction(s) that convert at least a portion of the nitric acid ($HNO_3$) in the etch solution 142 into various nitrogen species including, but not limited to, $HNO_2$. By adding the silicon-containing solution before the etch solution 142 is dispensed onto the substrate surface, the embodiments shown in FIGS. 5A and 5B increase the concentration of $HNO_2$ in the etch solution 142 at the location of dispense, thereby increasing the etch rate of the silicon-containing material on the semiconductor substrate 130 at the location of dispense and improving the etch uniformity across the substrate surface.

In some embodiments, the controller 160 shown in FIG. 1 may select the amount of silicon-containing solution added to the etch solution 142 to increase the $HNO_2$ concentration within the HF+$HNO_3$ etch solution by a desired amount. The amount of silicon or silica added to the etch solution 142 may generally be less than or equal to 5 g/L, as the etch rate decreases significantly above that amount.

Figure 6:
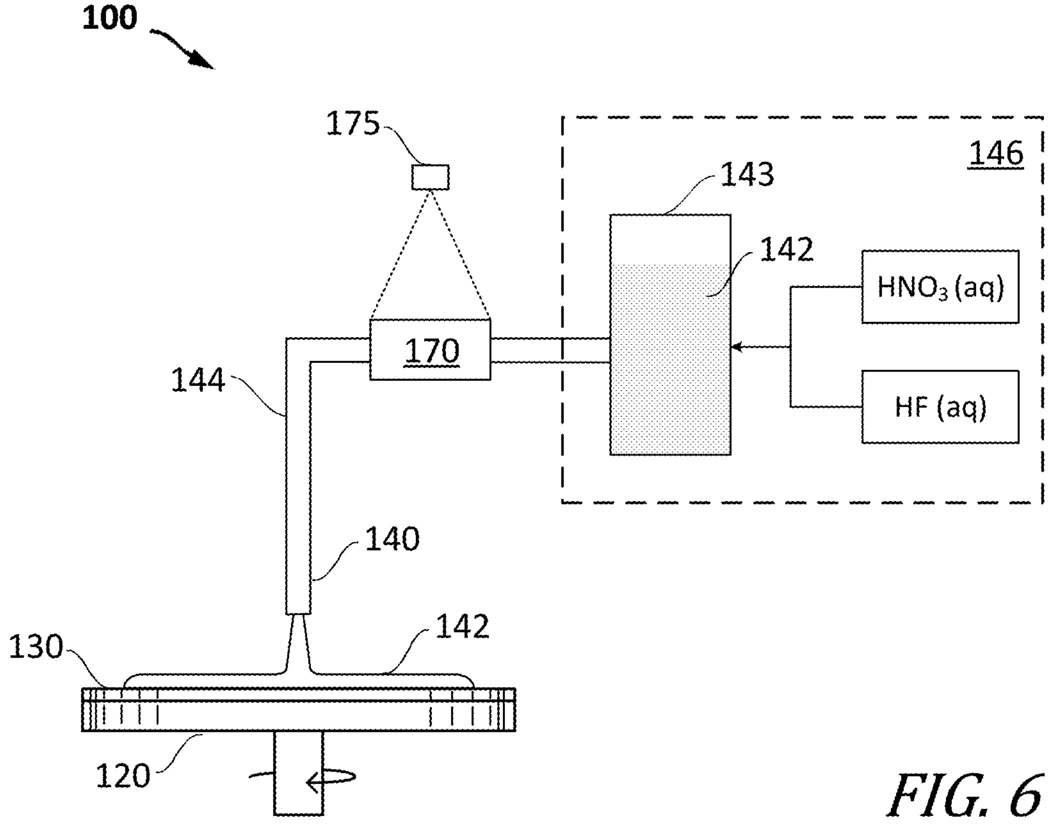
FIG. 6 illustrates a third method that can be used to increase the $HNO_2$ concentration of an HF+$HNO_3$ etch solution by utilizing UV photolysis of the nitric acid ($HNO_3$) in the HF+$HNO_3$ etch solution to generate $HNO_2$ prior to dispensing the etch solution onto the surface of a spinning substrate.

FIG. 6 illustrates a third method that can be used to increase the $HNO_2$ concentration within an HF+$HNO_3$ etch solution prior to dispensing the etch solution onto the surface of a spinning substrate. In the embodiment shown in FIG. 6, the $HNO_2$ concentration is increased in the HF+$HNO_3$ etch solution by using UV photolysis of the etch solution to generate $HNO_2$ prior to dispensing the etch solution onto the surface of the spinning substrate.

FIG. 6 depicts portions of the wet processing system 100 shown in FIG. 1, including the wafer support mechanism 120, at least one liquid nozzle 140 and chemical supply system 146. Like the previous embodiments, the chemical supply system 146 shown in FIG. 6 includes a chemical reservoir 143 containing an etch solution 142 comprising a mixture of hydrofluoric acid (HF) and nitric acid ($HNO_3$). In some embodiments, the etch solution 142 may be a mixture of 49 wt % HF and 70 wt % $HNO_3$ in water (or another solvent, such as acetic acid). Other mixtures of HF and $HNO_3$ in water or other solvents may also be used.

In the embodiment shown in FIG. 6, the wet processing system 100 further includes an ultra-violet (UV) transparent flow cell 170 coupled to the liquid supply line 144 and a UV source 175 for irradiating the etch solution 142 with UV radiation as the etch solution 142 passes through the UV transparent flow cell 170. The UV transparent flow cell 170 can include substantially any material that is sufficiently transparent to UV radiation, while also being inert to UV radiation and chemical attack from the etch solution 142. In some embodiments, the UV transparent flow cell 170 may be formed of (or include a window comprising) fused sapphire or UV-transparent Teflon or metal fluoride.

Exposing the etch solution 142 to UV radiation photolyzes the nitric acid ($HNO_3$) in the etch solution 142 into nitrous acid ($HNO_2$) to increase the concentration of nitrous acid ($HNO_2$) in the etch solution 142. By utilizing UV photolysis to generate $HNO_2$ before the etch solution 142 is dispensed onto the substrate surface, the embodiment shown in FIG. 6 increases the concentration of $HNO_2$ in the etch solution 142 at the location of dispense, thereby increasing the etch rate of the silicon-containing material on the semiconductor substrate 130 at the location of dispense and improving the etch uniformity across the substrate surface.

Figure 7:
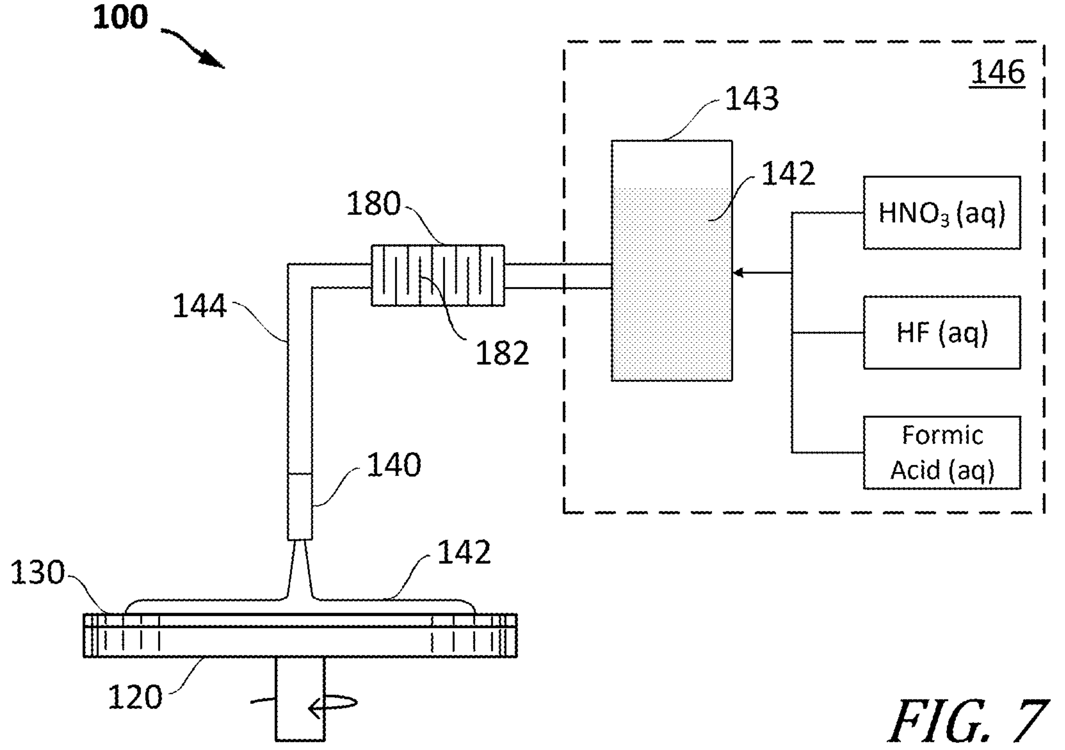
FIG. 7 illustrates a fourth method that can be used to increase the $HNO_2$ concentration of an HF+$HNO_3$ etch solution by using a noble metal surface catalyst to generate $HNO_2$ prior to dispensing the etch solution onto the surface of a spinning substrate.

FIG. 7 illustrates a fourth method that can be used to increase the $HNO_2$ concentration within an HF+$HNO_3$ etch solution prior to dispensing the etch solution onto the surface of a spinning substrate. In the embodiment shown in FIG. 7, the $HNO_2$ concentration is increased in the HF+$HNO_3$ etch solution by using formic acid and a noble metal surface catalyst to generate $HNO_2$ prior to dispensing the etch solution onto the surface of the spinning substrate.

FIG. 7 depicts portions of the wet processing system 100 shown in FIG. 1, including the wafer support mechanism 120, at least one liquid nozzle 140 and chemical supply system 146. In the embodiment shown in FIG. 7, the chemical supply system 146 includes a chemical reservoir 143 containing an etch solution 142 comprising a mixture of hydrofluoric acid (HF) and nitric acid ($HNO_3$). In some embodiments, the etch solution 142 may include 49 wt % HF and 70 wt % $HNO_3$ in water (or another solvent, such as acetic acid). Other mixtures of HF and $HNO_3$ in water or other solvents may also be used. In some embodiments, formic acid ($CH_2O_2$) may be added to the etch solution 142, as discussed further below.

In the embodiment shown in FIG. 7, the wet processing system 100 further includes a catalytic flow cell 180 coupled to the liquid supply line 144. The catalytic flow cell 180 includes a region of high surface area, which is formed of (or coated with) a noble metal (such as platinum, iridium, etc.). This noble metal surface 182 could be a porous metal foam, a series of mesh screens or a machined flow cell with a tortuous flow path that's coated with the noble metal catalyst. As the etch solution 142 passes through the catalytic flow cell 180, the noble metal surface 182 within the catalytic flow cell 180 catalyzes a reaction that converts at least a portion of the nitric acid ($HNO_3$) in the etch solution 142 into nitrous acid ($HNO_2$). By utilizing a noble metal catalyst to generate $HNO_2$ before the etch solution 142 is dispensed onto the substrate surface, the embodiment shown in FIG. 7 increases the concentration of $HNO_2$ in the etch solution 142 at the location of dispense, thereby increasing the etch rate of the silicon-containing material on the semiconductor substrate 130 at the location of dispense and improving the etch uniformity across the substrate surface.

In some embodiments, formic acid ($CH_2O_2$) can be added to the chemical reservoir 143 containing the etch solution 142 to increase the amount of nitrous acid ($HNO_2$) generated by passing the etch solution 142 through the catalytic flow cell 180. Though consumed in the $HNO_2$ generation, the formic acid ($CH_2O_2$) allows a higher concentration of $HNO_2$ to be formed. However, since $HNO_2$ is generated by exposing the etch solution to the noble metal catalyst, the addition of formic acid is considered to be an optional step.

The present disclosure provides various embodiments of wet processing systems and methods for processing a substrate, and more specifically, for improving etch uniformity across a semiconductor substrate when etching a silicon surface exposed on the semiconductor substrate with an HF+$HNO_3$ etch solution. The disclosed embodiments disclosed herein improve etch uniformity across the semiconductor substrate by increasing the concentration of nitrous acid ($HNO_2$) in the HF+$HNO_3$ etch solution prior to dispensing the HF+$HNO_3$ etch solution onto the silicon surface.

Various techniques are utilized herein to increase the concentration of nitrous acid ($HNO_2$) in the HF+$HNO_3$ etch solution prior to dispensing the HF+$HNO_3$ etch solution onto the silicon surface. As described in more detail above, the $HNO_2$ concentration can be increased in the HF+$HNO_3$ etch solution by: (a) supplying a nitrogen-containing gas to the etch solution, wherein addition of the nitrogen-containing gas causes the $HNO_2$ concentration to be increased to maintain equilibrium in the etch solution; (b) adding a silicon-containing solution to the etch solution to catalyze a reaction that converts a portion of the nitric acid ($HNO_3$) in the etch solution into nitrous acid ($HNO_2$); (c) exposing the etch solution to ultra-violet (UV) radiation, which photolyzes the nitric acid ($HNO_3$) in the etch solution into nitrous acid ($HNO_2$); and/or (d) exposing the etch solution to a noble metal surface, which catalyzes a reaction that converts a portion of the nitric acid ($HNO_3$) in the etch solution into nitrous acid ($HNO_2$). One of these techniques may be used alone, or a plurality may be used together, to increase the concentration of $HNO_2$ in the HF+$HNO_3$ etch solution prior to dispensing the HF+$HNO_3$ etch solution onto the silicon surface.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems and methods described herein will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for improving etch uniformity across a semiconductor substrate, the method comprising:

receiving the semiconductor substrate, the semiconductor substrate having a silicon-containing material exposed on a surface of the semiconductor substrate;

dispensing an etch solution onto the surface of the semiconductor substrate while the semiconductor substrate is spinning at a rotational speed, the etch solution comprising a mixture of hydrofluoric acid (HF) and nitric acid ($HNO_3$); and increasing a concentration of nitrous acid ($HNO_2$) within the etch solution prior to dispensing the etch solution onto the surface of the semiconductor substrate to improve etch uniformity of the silicon-containing material across the semiconductor substrate, wherein said increasing the concentration of nitrous acid ($HNO_2$) within the etch solution comprises exposing the etch solution to ultra-violet (UV) radiation or exposing the etch solution to a noble metal surface.

2. The method of claim 1, wherein the etch solution is dispensed onto the surface of the semiconductor substrate at a location of dispense, and wherein by increasing the concentration of nitrous acid ($HNO_2$) within the etch solution, the etch solution etches the silicon-containing material with a uniform etch rate from the location of dispense to an edge of the semiconductor substrate.

3. The method of claim 1, wherein the etch solution is dispensed onto the surface of the semiconductor substrate at a center of the semiconductor substrate, and wherein by increasing the concentration of nitrous acid ($HNO_2$) within the etch solution, the etch solution etches the silicon-containing material with a uniform etch rate from the center of the semiconductor substrate to an edge of the semiconductor substrate.

4. The method of claim 1, wherein the silicon-containing material exposed on the surface of the semiconductor substrate comprises crystalline silicon, amorphous silicon, epitaxial silicon, polysilicon, or silicon dioxide ($SiO_2$).

5. The method of claim 1, wherein said increasing the concentration of nitrous acid ($HNO_2$) within the etch solution further comprises:

supplying a nitrogen-containing gas to a chemical reservoir containing the etch solution to increase the concentration of nitrous acid ($HNO_2$) in the etch solution.

6. The method of claim 5, wherein the nitrogen-containing gas is a nitrogen dioxide ($NO_2$) gas.

7. The method of claim 1, wherein said increasing the concentration of nitrous acid ($HNO_2$) within the etch solution further comprises:

adding a silicon-containing solution to the etch solution to increase the concentration of nitrous acid ($HNO_2$) in the etch solution.

8. The method of claim 7, wherein the silicon-containing solution comprises silica dissolved in aqueous solution.

9. The method of claim 7, wherein the silicon-containing solution is supplied to: (a) a chemical reservoir containing the etch solution, or (b) a liquid supply line, which is coupled to a liquid nozzle for dispensing the etch solution onto the surface of the semiconductor substrate.

10. The method of claim 1, wherein said increasing the concentration of nitrous acid ($HNO_2$) within the etch solution further comprises one or more of the following:

(a) supplying a nitrogen-containing gas to a chemical reservoir containing the etch solution, wherein addition of the nitrogen-containing gas to the etch solution causes the concentration of nitrous acid ($HNO_2$) in the etch solution to be increased to maintain equilibrium in the etch solution; and (b) adding a silicon-containing solution to the etch solution, wherein the silicon-containing solution catalyzes a reaction to convert a portion of the nitric acid ($HNO_3$) in the etch solution into nitrous acid ($HNO_2$) to increase the concentration of nitrous acid ($HNO_2$) in the etch solution.

11. The method of claim 1, wherein the concentration of nitrous acid ($HNO_2$) within the etch solution is increased by exposing the etch solution to ultra-violet (UV) radiation, and wherein the UV radiation photolyzes the nitric acid ($HNO_3$) in the etch solution into nitrous acid ($HNO_2$) to increase the concentration of nitrous acid ($HNO_2$) in the etch solution.

12. The method of claim 11, wherein said exposing the etch solution to UV radiation comprises:

irradiating the etch solution with UV radiation as the etch solution passes through a flow cell, which is: (a) transparent to the UV radiation, and (b) coupled to a liquid supply line coupled to a liquid nozzle for dispensing the etch solution onto the surface of the semiconductor substrate.

13. The method of claim 1, wherein the concentration of nitrous acid ($HNO_2$) within the etch solution is increased by exposing the etch solution to the noble metal surface, and wherein the noble metal surface catalyzes a reaction that converts a portion of the nitric acid ($HNO_3$) in the etch solution into nitrous acid ($HNO_2$) to increase the concentration of nitrous acid ($HNO_2$) in the etch solution.

14. The method of claim 13, wherein said exposing the etch solution to the noble metal surface comprises:

passing the etch solution through a catalytic flow cell comprising the noble metal surface;

wherein the catalytic flow cell is coupled to a liquid supply line, which is coupled to a liquid nozzle for dispensing the etch solution onto the surface of the semiconductor substrate; and wherein the noble metal surface comprises a platinum surface or an iridium surface.

15. A method for improving etch uniformity across a semiconductor substrate, the method comprising:

receiving the semiconductor substrate, the semiconductor substrate having a silicon-containing material exposed on a surface of the semiconductor substrate;

dispensing an etch solution onto the surface of the semiconductor substrate while the semiconductor substrate is spinning at a rotational speed, the etch solution comprising a mixture of hydrofluoric acid (HF) and nitric acid ($HNO_3$); and increasing a concentration of nitrous acid ($HNO_2$) within the etch solution prior to dispensing the etch solution onto the surface of the semiconductor substrate to improve etch uniformity of the silicon-containing material across the semiconductor substrate, wherein said increasing the concentration of nitrous acid ($HNO_2$) within the etch solution comprises:

exposing the etch solution to ultra-violet (UV) radiation, wherein the UV radiation photolyzes the nitric acid ($HNO_3$) in the etch solution into nitrous acid ($HNO_2$) to increase the concentration of nitrous acid ($HNO_2$) in the etch solution.

16. The method of claim 15, wherein said exposing the etch solution to UV radiation comprises:

irradiating the etch solution with UV radiation as the etch solution passes through a flow cell, which is: (a) transparent to the UV radiation, and (b) coupled to a liquid supply line coupled to a liquid nozzle for dispensing the etch solution onto the surface of the semiconductor substrate.

17. A method for improving etch uniformity across a semiconductor substrate, the method comprising:

receiving the semiconductor substrate, the semiconductor substrate having a silicon-containing material exposed on a surface of the semiconductor substrate;

dispensing an etch solution onto the surface of the semiconductor substrate while the semiconductor substrate is spinning at a rotational speed, the etch solution comprising a mixture of hydrofluoric acid (HF) and nitric acid ($HNO_3$); and increasing a concentration of nitrous acid ($HNO_2$) within the etch solution prior to dispensing the etch solution onto the surface of the semiconductor substrate to improve etch uniformity of the silicon-containing material across the semiconductor substrate, wherein said increasing the concentration of nitrous acid ($HNO_2$) within the etch solution comprises:

exposing the etch solution to a noble metal surface, wherein the noble metal surface catalyzes a reaction that converts a portion of the nitric acid ($HNO_3$) in the etch solution into nitrous acid ($HNO_2$) to increase the concentration of nitrous acid ($HNO_2$) in the etch solution.

18. The method of claim 17, wherein said exposing the etch solution to the noble metal surface comprises:

passing the etch solution through a catalytic flow cell comprising the noble metal surface;

wherein the catalytic flow cell is coupled to a liquid supply line, which is coupled to a liquid nozzle for dispensing the etch solution onto the surface of the semiconductor substrate; and wherein the noble metal surface comprises a platinum surface or an iridium surface.

19. The method of claim 17, wherein said increasing the concentration of nitrous acid ($HNO_2$) within the etch solution further comprises:

supplying formic acid ($CH_2O_2$) to a chemical reservoir containing the etch solution to increase an amount of nitrous acid ($HNO_2$) generated during said exposing the etch solution to the noble metal surface.

20. The method of claim 17, wherein the concentration of nitrous acid ($HNO_2$) within the etch solution is further increased by:

supplying formic acid ($CH_2O_2$) to a chemical reservoir containing the etch solution to increase an amount of nitrous acid ($HNO_2$) generated during said exposing the etch solution to the noble metal surface.

* * * * *